United States Patent [19]
Goodman et al.

[11] Patent Number: 4,684,413
[45] Date of Patent: Aug. 4, 1987

[54] METHOD FOR INCREASING THE SWITCHING SPEED OF A SEMICONDUCTOR DEVICE BY NEUTRON IRRADIATION

[75] Inventors: Alvin M. Goodman, Princeton Township, Mercer County; Lawrence A. Goodman, Plainsboro; John P. Russell, Hopewell Township, Mercer County; Paul H. Robinson, Lawrence Township, Mercer County, all of N.J.

[73] Assignee: RCA Corporation, Princeton, N.J.

[21] Appl. No.: 784,726

[22] Filed: Oct. 7, 1985

[51] Int. Cl.⁴ .................. H01L 21/265; H01L 27/02
[52] U.S. Cl. .......................... 437/17; 148/DIG. 165; 357/91; 437/247; 437/8
[58] Field of Search ............... 148/1.5, 187; 29/576 B, 29/574; 357/91

[56] References Cited

U.S. PATENT DOCUMENTS

| | | | |
|---|---|---|---|
| 4,135,951 | 1/1979 | Stone | 148/1.5 |
| 4,234,355 | 11/1980 | Meinders | 148/1.5 |
| 4,240,844 | 12/1980 | Felice et al. | 148/1.5 |
| 4,328,610 | 5/1982 | Thompson et al. | 29/571 |
| 4,506,436 | 3/1985 | Bakeman, Jr. et al. | 29/577 G |
| 4,521,256 | 6/1985 | Hiraki et al. | 148/1.5 |

OTHER PUBLICATIONS

"Neutron Irradiation for Prevention of Latch-Up in MOS Integrated Circuits", J. R. Adams et al., *IEEE Transactions on Nuclear Science*, vol. NS-26, No. 6, Dec. 1979, pp. 5069–5073.

"Neutron Damage in PIN Diode Phase Shifters for Radar Arrays", G. J. Brucker et al., *IEEE Transactions on Nuclear Science*, vol. NS-25, No. 6, Dec. 1978, pp. 1528–1533.

"Improved COMFETs With Fast Switching Speed and High-Current Capability", A. M. Goodman et al., *Proceedings of the IEEE International Electron Devices Meeting*, Dec. 1983, pp. 79–82.

Komaleeva et al., Sov. Phys. Semiconduct., 10 (Feb. 1976) 191.

Guldberg, J. Phys. D Appl. Phys., 11 (1978) 2043.

Spour, IEEE Trans. Nucl. Sc., NS-20 (1973) 190.

*Primary Examiner*—Upendra Roy
*Attorney, Agent, or Firm*—Birgit E. Morris; Kenneth R. Glick; Bernard F. Plantz

[57] ABSTRACT

A method for decreasing the turnoff time in a crystalline semiconductor region within a semiconductor device comprises initially providing a semiconductor region having a predetermined density of pinning centers. The semiconductor region is then irradiated so as to yield crystal damage that is equivalent to or greater than that which would be produced by irradiating with 1 MeV neutrons at a fluence greater than approximately $10^{13}$ cm$^{-2}$. The region is then annealed at a temperature of approximately 350° to 450° C. for approximately 15 minutes to one hour so as to yield a density of stable recombination centers correlating with the pinning centers that provides a stable minority carrier lifetime within the semiconductor region.

11 Claims, 1 Drawing Figure

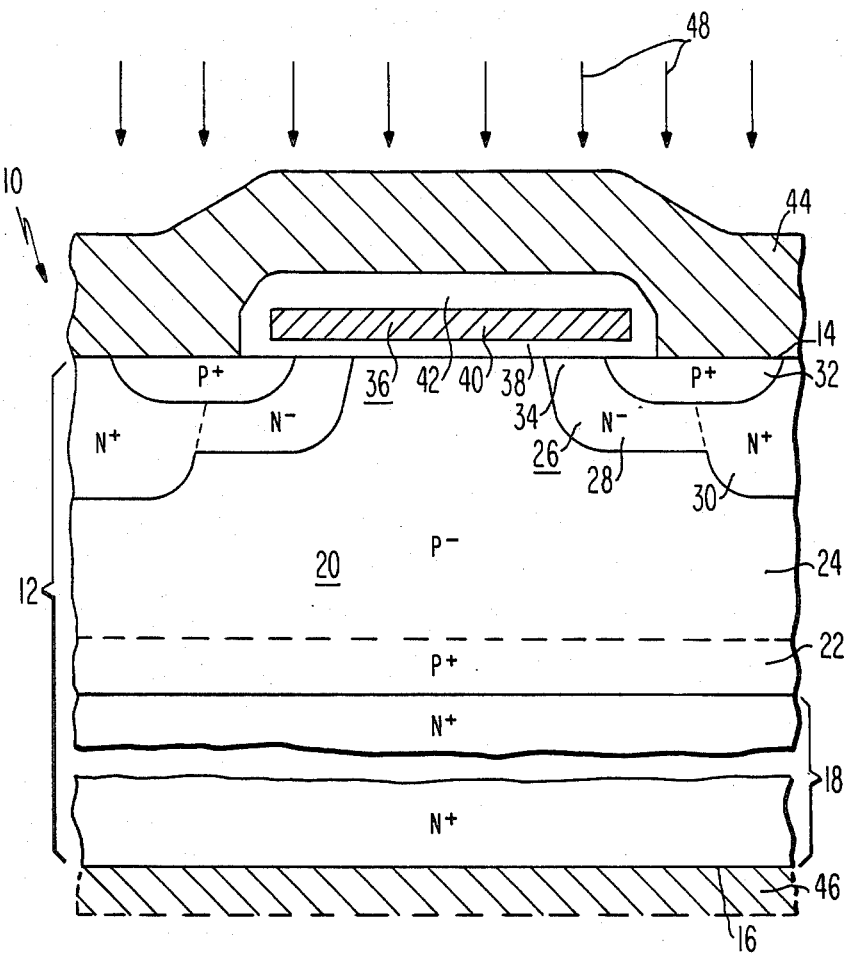

METHOD FOR INCREASING THE SWITCHING SPEED OF A SEMICONDUCTOR DEVICE BY NEUTRON IRRADIATION

The present invention relates to a method for reducing the minority carrier lifetime and hence the turnoff time in a semiconductor region within a semiconductor device. More particularly, the invention relates to a process in which the semiconductor region is irradiated with fast neutrons.

BACKGROUND OF THE INVENTION

In semiconductor devices it is desirable to be able to control minority carrier lifetime i.e. the time in which an electron will recombine in a P type semiconductor region or a hole will recombine in an N type semiconductor region. A relatively low minority carrier lifetime permits a semiconductor device to have a relatively fast switching speed and in the case of a field effect transistor (FET) reduces the gain of the parasitic bipolar transistor.

To reduce minority carrier lifetime, the literature conventionally teaches such processes as heavy metal doping or irradiation with electrons, x-rays, alpha particles, gamma rays or neutrons. As would be expected, a variety of advantages and disadvantages is associated with each of these lifetime-killing processes. In the case of neutron irradiation many of the practical disadvantages have been overcome. For example, the problem of residual long term radioactivity has been avoided by irradiating at an appropriate point during processing and the problem of inadvertent transmutation doping of the semiconductor material has been overcome by using certain radiation shielding. One of the difficulties that nonetheless remains in the long term stability of the neutron-induced crystalline damage. That is, in some cases the stability of the minority carrier lifetime induced by conventional neutron irradiation is unacceptably low. In an effort to analyze the source of this stability problem the present invention was discovered.

SUMMARY OF THE INVENTION

A method for decreasing the turnoff time in a crystalline semiconductor region within a semiconductor device comprises initially providing a semiconductor region having a predetermined density of pinning centers. The semiconductor region is then irradiated so as to yield crystal damage that is equivalent to or greater than that which would be produced by irradiating with 1 MeV neutrons at a fluence greater than approximately $10^{13}$ cm$^{-2}$. The region is then annealed at a temperature of approximately 350° to 450° C. for approximately 15 minutes to one hour so as to yield a density of stable recombination centers correlating with the pinning centers that provides a stable minority carrier lifetime within the semiconductor region.

BRIEF DESCRIPTION OF THE DRAWING

The drawing FIGURE illustrates a sectional view of the salient features of an exemplary semiconductor device to which the subject invention is applicable.

DETAILED DESCRIPTION OF PREFERRED EMBODIMENT

The drawing FIGURE illustrates a P channel conductivity modulated field effect transistor (COMFET) device 10. It should be understood, however, that the process of the present invention is not limited to P channel COMFETs. For example, the inventive process is applicable to field effect transistors (FETs) generally as well as to bipolar devices such as thyristors and rectifiers. A P channel COMFET is illustrated because the invention provides a solution to a previously unknown and unexpected problem discovered during the development of such devices.

The COMFET device 10 comprises a monocrystalline semiconductor wafer 12 having opposing, substantially planar first and second major surfaces 14 and 16 respectively. A cathode region 18 of N+ type conductivity is disposed immediately adjacent the second surface 16 and a drain region 20 of P type conductivity is contiguous with cathode region 18 and extends to the first surface 14. The drain region 20 typically incorporates a relatively high conductivity portion 22 of P+ type conductivity adjacent to the cathode region and a relativity low conductivity portion of P— type conductivity, commonly referred to as an extended drain region 24, which extends to the first surface 14.

Extending into the wafer 12 from the first surface 14 is at least one body region 26 of N type conductivity. The body region 26 typically incorporates a relatively low conductivity N— type portion 28 and a relatively high conductivity N+ type portion 30 as shown. A source region 32 of P+ type conductivity extends into the wafer from the surface 14 so as to define the length and width of a channel region 34 in the low conductivity portion of the body region 28.

An insulated gate electrode 36 is disposed on the first surface 14 so as to overlie the channel region 34. The insulated gate electrode comprises an oxide layer 38 directly on the first surface 14 and a conductive gate electrode 40, preferably of doped polycrystalline silicon, on the oxide layer 38. A layer of insulation 42, of a material such as phosphosilicate glass (PSG) or borophosphosilicate glass (BPSG), overlies the insulated gate electrode 36 so as to electrically isolate the gate electrode 40 from overlying conductive layers. A source electrode 44 and drain electrode 46 contact the first and second surfaces 14 and 16 respectively. The drain electrode 46 is shown in phantom in the FIGURE because in the stage of the fabrication process at which the neutron irradiation occurs, it is typically not present. The source electrode 44, which in the preferred embodiment is aluminum, contacts the source region 32 and the high conductivity portion of the body region 30 at the first surface 14 and it overlies the insulation 42. The drain electrode 46, which in the preferred embodiment comprises a full layer aluminum/titanium/nickel structure, is substantially planar and substantially uniformly covers the cathode region 18 at the second surface 16.

An exemplary processing sequence for the device 10 is as follows.

(1) Provide a heavily doped monocrystalline silicon substrate of N type conductivity (e.g. doped with arsenic to approximately $10^{19}$ cm$^{-3}$).

(2) Epitaxially deposit a P+ type monocrystalline silicon type layer 22 on a major surface of the substrate.

(3) Epitaxially deposit a monocrystalline silicon P— type extended drain region 24, the surface of which forms the first major surface 14.

(4) Provide a predetermined density of pinning centers in the extended drain region 24. (This step may alternatively be performed simultaneously with the deposition of the extended drain region 24.)

(5) Implant and diffuse the N+ type portion 30 of the body region.

(6) Form the gate oxide 38 and deposit and photolithographically define the gate electrode 40.

(7) Implant and diffuse the N− type body region 28.

(8) Implant and diffuse the source region 32.

(9) Deposit, flow and pattern insulation 42 of PSG or BPSG over the insulated gate electrode.

(10) Deposit an aluminum source electrode 44.

(11) Subject the structure to neutron irradiation 48 so as to yield crystalline damage equivalent to irradiating with 1 MeV neutrons at a fluence greater than approximately $10^{13}$ cm$^{-2}$.

(12) Anneal the structure at approximately 350° to 450° C. for approximately 15 minutes to 1 hour.

(13) Form the drain electrode 46.

In the process of the present invention it is critical that the semiconductor region in which the minority carrier lifetime is to be reduced incorporate a predetermined density of what are termed herein "pinning centers." A pinning center may be defined as a location of crystallographic strain and may be caused by crystallographic defects such as dislocations or by the presence of impurity atoms which stress the lattice of the crystalline material. It appears that the density of pinning centers must exceed 0.1 ppma (part per million atomic) and that a useful density is in the range of approximately 0.5 to 1.5 ppma. For example, for device 10 where it is desirable to have a relatively low minority carrier lifetime within the drain region 20, pinning centers can be provided by introducing oxygen during the epitaxial growth of the extended drain region 24, by subsequent high temperature oxidation and diffusion, or by subsequent ion implantation and diffusion.

It was during the fabrication of a P channel device 10 that the necessity of the pinning centers was discovered. When previously fabricating an N channel COMFET equivalent to device 10 (i.e. substantially a device 10 wherein all conductivity types are reversed) by a process that included a similar neutron irradiation and annealing sequence, reasonably stable devices resulted. Apparently, this occurred because the P+ type substrate on which the N channel COMFET was formed was doped with boron, which created a significantly crystallographically strained substrate, thereby providing a source from which defects could readily propagate into an epitaxial layer grown thereon. However, when we attempted to fabricate a P channel COMFET device 10 without a processing step which provided pinning centers, the effects of the subsequent neutron irradiation and annealing were not stable. This is apparently because the N+ type substrate of the P channel COMFET was doped with arsenic, a dopant which fits into the silicon crystal lattice without significant stress being created.

Additionally, we have discovered that when neutron irradiation and annealing is used to control the minority carrier lifetime in silicon which has previously been subjected to a float zone process, it is also necessary to provide pinning centers prior to the irradiation. This is apparently because the float zone material is relatively chemically pure and crystallography of good quality thereby providing a relatively low density of pinning centers.

In the neutron irradiation step of the present invention we have found that it is necessary to create crystal damage (in the semiconductor region in which minority carrier lifetime is to be controlled) equivalent to that which would be created by irradiating with 1 MeV neutrons at a fluence greater than approximately $10^{13}$ cm$^{-2}$. That is, one should use what are commonly referred to as fast neutrons as opposed to slow or thermal neutrons. A good source of fast neutrons is a nuclear reactor such as the Breazeale nuclear reactor at Pennsylvania State University, State College, Pa. During irradiation in such a reactor it is desirable to shield the wafers from thermal neutrons by suitable sheilding of, for example, boral or cadmium. Additionally, when the wafers include MOS devices, they should be protected from gamma rays, for example by lead shielding, so as to prevent damage to the gate oxides that are present.

Although the neutron irradiation step can be performed at one of several points during the processing, in the preferred embodiment it should be performed at a point when the wafer does not include any elements which will transmute into inconveniently long lived radioisotopes. For example, the wafer should preferably be irradiated before elements such as Sb, Ni, Sn, Cu, Au, Pt or Fe are incorporated into the device. On the other hand, the commonly used elements Si, B, P, Al, O, N, Ti and Pb have either sufficiently low cross sections for absorption of neutrons or sufficiently short half lives in their respective radioactive isotopes that a practical irradiation process will permit the irradiation of these elements.

The third critical step of the process of the present invention is the annealing of the irradiated semiconductor region. We have determined that subjecting the region to a temperature of approximately 350° to 450° C. for approximately 15 minutes to one hour yields a device having a stable minority carrier lifetime and stable oxides on the surface thereof. We have found that there is not a need for a particular cooling rate after this high temperature annealing but that the high temperature exposure is necessary to yield stable gate oxides (for FETs) and stable field oxides (for FETs as well as other types of devices).

The described process typically yields devices having very short yet stable switching times. Typically the switching times produced (i.e. the turnoff time as measured by the standard 90% to 10% decay technique) is less than approximately 0.5 microseconds. This process can also repeatably produce devices having turnoff times in the 10 to 100 nanosecond range by empirically determining a suitable pinning center density and neutron radiation flux. An appropriate pinning center density, as determined by the oxidation cycle to which the semiconductor region is subjected, can be determined in an iterative manner, e.g. by oxidizing at various oxygen concentrations and temperatures, irradiating and annealing, and measuring minority carrier lifetime.

What is claimed is:

1. A method for decreasing turnoff time in a crystalline semiconductor region within a semiconductor device comprising the steps of:
   providing pinning centers, at a density greater than 0.1 ppma, in the semiconductor region;
   irradiating the region so as to yield crystal damage that is equivalent to or greater than irradiating with 1 MeV neutrons at a fluence greater than approximately $10^{13}$ cm$^{-2}$; and
   annealing the region at approximately 350°–450° C. for approximately 15 minutes to 1 hour so as to yield a density of stable recombination centers correlating with the pinning centers that provide a stable minority carrier lifetime within the region.

2. A method in accordance with claim 1 wherein the semiconductor region is silicon of P type conductivity.

3. A method in accordance with claim 1 wherein the semiconductor region is silicon of N type conductivity.

4. A method in accordance with claim 1 further comprising an oxide at the surface of the semiconductor device.

5. A method in accordance with claim 1 wherein said pinning centers are provided by introducing crystalline defects during the formation of said semiconductor region.

6. A method in accordance with claim 1 wherein said pinning centers are provided by introducing crystalline defects subsequent to the formation of said semiconductor region.

7. A method in accordance with claim 1 wherein said pinning centers are provided by epitaxially forming said semiconductor region in the presence of oxygen.

8. A method in accordance with claim 1 wherein said pinning centers are provided by oxidizing said semiconductor region and subjecting the oxidized region to a diffusion cycle.

9. A method in accordance with claim 1 wherein said pinning centers are provided by ion implanting oxygen into said semiconductor region and diffusing the oxygen within the semiconductor region.

10. A method in accordance with claim 1 wherein said semiconductor region is silicon produced by a float zone process.

11. A method in accordance with claim 1 wherein said predetermined density is approximately 0.5 to 1.5 ppma.

* * * * *